US010508181B2

(12) United States Patent
Someya et al.

(10) Patent No.: US 10,508,181 B2
(45) Date of Patent: Dec. 17, 2019

(54) BOTTOM LAYER FILM-FORMATION COMPOSITION OF SELF-ORGANIZING FILM CONTAINING POLYCYCLIC ORGANIC VINYL COMPOUND

(71) Applicant: NISSAN CHEMICAL INDUSTRIES, LTD., Tokyo (JP)

(72) Inventors: Yasunobu Someya, Toyama (JP); Hiroyuki Wakayama, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 807 days.

(21) Appl. No.: 14/651,998

(22) PCT Filed: Dec. 13, 2013

(86) PCT No.: PCT/JP2013/083492
§ 371 (c)(1),
(2) Date: Jun. 12, 2015

(87) PCT Pub. No.: WO2014/097993
PCT Pub. Date: Jun. 26, 2014

(65) Prior Publication Data
US 2015/0322219 A1    Nov. 12, 2015

(30) Foreign Application Priority Data

Dec. 18, 2012    (JP) .................................. 2012-276135

(51) Int. Cl.
*C08J 5/18* (2006.01)
*B05D 3/02* (2006.01)
(Continued)

(52) U.S. Cl.
CPC ................ *C08J 5/18* (2013.01); *B05D 1/005* (2013.01); *B05D 1/322* (2013.01); *B05D 3/0254* (2013.01);
(Continued)

(58) Field of Classification Search
CPC .................................................... C08J 2325/08
See application file for complete search history.

(56) References Cited

U.S. PATENT DOCUMENTS

| 4,777,227 A | * | 10/1988 | Wrezel | ................. | H05K 1/0353 |
| | | | | | 525/207 |
| 2009/0253076 A1 | * | 10/2009 | Sakaguchi | .............. | G03F 7/091 |
| | | | | | 430/286.1 |
| 2014/0030652 A1 | * | 1/2014 | Senzaki | ................. | C08L 53/00 |
| | | | | | 430/270.1 |

FOREIGN PATENT DOCUMENTS

| JP | H02-22657 A | 1/1990 |
| JP | 2003-218383 A | 7/2003 |

(Continued)

OTHER PUBLICATIONS

Mizokuro et al., "Addition of Functional Characteristics of Organic Photochromic Dye to Nano-Structures by Selective Doping on a Polymer Surface," Japanese Journal of Applied Physics, pp. 983-985, vol. 42, Part 2, No. 8A, 2003.

(Continued)

*Primary Examiner* — Ian A Rummel
(74) *Attorney, Agent, or Firm* — Oliff PLC

(57) ABSTRACT

An underlayer film-forming composition for a self-assembled film having a polymer including 0.2% by mole or more of a unit structure of a polycyclic aromatic vinyl compound relative to all unit structures of the polymer. The polymer includes 20% by mole or more of a unit structure of an aromatic vinyl compound relative to all the unit structures of the polymer and includes 1% by mole or more (Continued)

of a unit structure of the polycyclic aromatic vinyl compound relative to all the unit structures of the aromatic vinyl compound. The aromatic vinyl compound includes an optionally substituted vinylnaphthalene, acenaphthylene, or vinylcarbazole, and the polycyclic aromatic vinyl compound is vinylnaphthalene, acenaphthylene, or vinylcarbazole. The aromatic vinyl compound includes an optionally substituted styrene and an optionally substituted vinylnaphthalene, acenaphthylene, or vinylcarbazole, and the polycyclic aromatic vinyl compound is vinylnaphthalene, acenaphthylene, or vinylcarbazole.

11 Claims, 1 Drawing Sheet

(51) Int. Cl.
| | | |
|---|---|---|
| *B05D 1/32* | (2006.01) | |
| *B05D 1/00* | (2006.01) | |
| *C09D 139/04* | (2006.01) | |
| *C09D 145/00* | (2006.01) | |
| *C09D 201/00* | (2006.01) | |
| *C09D 153/00* | (2006.01) | |
| *G03F 7/00* | (2006.01) | |
| *C08F 212/32* | (2006.01) | |

(52) U.S. Cl.
CPC .......... *C08F 212/32* (2013.01); *C09D 139/04* (2013.01); *C09D 145/00* (2013.01); *C09D 153/00* (2013.01); *C09D 201/00* (2013.01); *G03F 7/0002* (2013.01); *C08J 2325/02* (2013.01); *C08J 2325/08* (2013.01); *C08J 2325/14* (2013.01); *C08J 2333/12* (2013.01); *C08J 2339/04* (2013.01); *Y10T 428/24802* (2015.01)

(56) References Cited

FOREIGN PATENT DOCUMENTS

| | | | |
|---|---|---|---|
| JP | 2007-284623 A | 11/2007 | |
| JP | 2008-149447 A | 7/2008 | |
| JP | 2008-242453 A | 10/2008 | |
| JP | 2009-025670 A | 2/2009 | |
| JP | 2009-234114 A | 10/2009 | |
| JP | 2009-251130 A | 10/2009 | |
| JP | 2011-122081 A | 6/2011 | |
| JP | WO 2012036121 A1 * | 3/2012 | ............ C08L 53/00 |
| JP | 2012-167160 A | 9/2012 | |
| JP | 2013-212569 A | 10/2013 | |
| JP | 2013-216859 A | 10/2013 | |
| WO | 2007/023710 A1 | 3/2007 | |
| WO | 2008-111463 A1 | 9/2008 | |
| WO | 2011/102470 A1 | 8/2011 | |
| WO | 2012/036121 A1 | 3/2012 | |
| WO | 2012/165507 A1 | 12/2012 | |
| WO | 2013/146600 A1 | 10/2013 | |

OTHER PUBLICATIONS

Asakawa et al., "Nanopatterning with Microdomains of Block Copolymers using Reactive-Ion Etching Selectivity," Japanese Journal of Applied Physics, pp. 6112-6118, vol. 41, Part 1, No. 10, 2002.
Segalman, Rachel A., "Patterning with block copolymer thin films," Materials Science and Engineering, pp. 191-226, R48, 2005.
Mar. 25, 2014 International Search Report issued in International Application No. PCT/JP2013/083492.
Mar. 25, 2014 Written Opinion of the International Searching Authority issued in International Application No. PCT/JP2013/083492.

* cited by examiner

BOTTOM LAYER FILM-FORMATION COMPOSITION OF SELF-ORGANIZING FILM CONTAINING POLYCYCLIC ORGANIC VINYL COMPOUND

TECHNICAL FIELD

The present invention relates to an underlayer film-forming composition for forming an underlayer film of a self-assembled film, and the underlayer film formed by heat baking the underlayer film-forming composition is used for liquid crystal displays, recording materials for hard disks, solid-state image sensing devices, solar cell panels, light emitting diodes, organic light emitting devices, luminescent films, fluorescent films, MEMS, actuators, anti-reflective materials, resists, resist underlayer films, resist upper layer films, templates (molds) for nanoimprint, and other devices. The present invention also relates to a method for forming a pattern structure constituting a self-assembled film using the underlayer film-forming composition.

BACKGROUND ART

Self-assembled films having a nanoscale repeating structure are known to have different characteristics from those of common homogeneous films, and a self-assembled film having a nanoscale repeating structure including a block polymer has been applied.

For example, the characteristics of a mixture of an organic photochromic material with a non-curable polystyrene/poly(methyl methacrylate) copolymer have been described (Non-Patent Document 1).

The characteristics of nano-patterning prepared by plasma etching using a non-curable polystyrene/poly(methyl methacrylate) copolymer have also been described (Patent Document 2).

The characteristics of nano-patterning prepared by using a non-curable polystyrene/poly(methyl methacrylate) copolymer have also been described (Patent Document 3).

A coating composition has been described that is used for thin films and includes a block polymer configured to contain a polymer chain having a fluorine-containing vinyl monomer unit and a polymer chain including a vinyl monomer unit having at least a silyl group (see Patent Document 1).

A pattern formation method by regularly arranging a plurality of segments constituting a block polymer to form a pattern in a block polymer layer has been described (see Patent Document 2).

A film-forming composition including a block polymer, a crosslinking agent, and an organic solvent has been described. In a self-assembled film prepared by using the film-forming composition, an underlayer film (for example, an organic film is used) can have pattern information in order to pattern the block polymer in a cylinder shape. In order to arrange a pattern at an intended position on an underlayer film (for example, an organic film) on a processing substrate, ultraviolet rays or radiation rays are applied so as to overlap with the arranging position to cause a variation of unevenness or surface energy (hydrophilic/hydrophobic). Thus, a polymer chain (A) component and a polymer chain (B) component in a (self-assembled) film-forming composition including a block polymer can be arranged at respective intended positions (see Patent Document 3).

PRIOR ART DOCUMENTS

Patent Documents

Patent Document 1: Japanese Patent Application Publication No. 2007-284623 (JP 2007-284623 A)
Patent Document 2: Japanese Patent Application Publication No. 2009-234114 (JP 2009-234114 A)
Patent Document 3: Japanese Patent Application Publication No. 2011-122081 (JP 2011-122081 A)

Non-Patent Documents

Non-Patent Document 1: Toshiko Mizokuro et al., Japanese Journal of Applied Physics, 42, L983 (2003)
Non-Patent Document 2: Koji Asakawa et al., Japanese Journal of Applied Physics, 41, 6112 (2002)
Non-Patent Document 3: Rachel A. Segalaman, Materials Science and Engineering, R48, 191 (2005)

SUMMARY OF THE INVENTION

Problem to be Solved by the Invention

The present invention provides a composition for forming an underlayer film that is advantageously used for facilitating the arrangement of a self-assembled film including a block polymer or the like into a desired vertical pattern when the self-assembled film is formed. The present invention also provides a composition that is used for forming an underlayer film for a self-assembled film and that does not intermix (layer-mix) with the self-assembled film as the upper layer and that enables the formation of a vertical pattern of the self-assembled film.

Means for Solving the Problem

The present invention provides: as, a first aspect, an underlayer film-forming composition for a self-assembled film, the underlayer film-forming composition characterized by comprising a polymer including 0.2% by mole or more of a unit structure of a polycyclic aromatic vinyl compound relative to all unit structures of the polymer;

as a second aspect, the underlayer film-forming composition for a self-assembled film according to the first aspect, characterized in that the polymer includes 20% by mole or more of a unit structure of an aromatic vinyl compound relative to all the unit structures of the polymer and includes 1% by mole or more of a unit structure of the polycyclic aromatic vinyl compound relative to all the unit structures of the aromatic vinyl compound;

as a third aspect, the underlayer film-forming composition for a self-assembled film according to the second aspect, in which the aromatic vinyl compound includes an optionally substituted vinylnaphthalene, an optionally substituted acenaphthylene, or an optionally substituted vinylcarbazole, and the polycyclic aromatic vinyl compound is vinylnaphthalene, acenaphthylene, or vinylcarbazole;

as a fourth aspect, the underlayer film-forming composition for a self-assembled film according to the second aspect or the third aspect, in which the aromatic vinyl compound includes an optionally substituted styrene and an optionally substituted vinylnaphthalene, an optionally substituted acenaphthylene, or an optionally substituted vinylcarbazole, and the polycyclic aromatic vinyl compound is vinylnaphthalene, acenaphthylene, or vinylcarbazole;

as a fifth aspect, the underlayer film-forming composition for a self-assembled film according to any one of the second aspect to the fourth aspect, in which the aromatic vinyl compound is an optionally substituted styrene and an optionally substituted vinylnaphthalene, an optionally substituted acenaphthylene, or an optionally substituted vinylcarbazole, and the polycyclic aromatic vinyl compound is an optionally substituted vinylnaphthalene, an optionally substituted acenaphthylene, or an optionally substituted vinylcarbazole;

as a sixth aspect, the underlayer film-forming composition for a self-assembled film according to any one of the second aspect to the fifth aspect, in which the aromatic vinyl compound consists of a polycyclic aromatic vinyl compound only, and the aromatic vinyl compound is an optionally substituted vinylnaphthalene, an optionally substituted acenaphthylene, or an optionally substituted vinylcarbazole;

as a seventh aspect, the underlayer film-forming composition for a self-assembled film according to any one of the second aspect to the sixth aspect, in which the polymer includes 60% by mole to 95% by mole of a unit structure of the aromatic vinyl compound relative to all the unit structures of the polymer;

as an eighth aspect, the underlayer film-forming composition for a self-assembled film according to any one of the first aspect to the seventh aspect, in which the polymer further includes a unit structure having a crosslinkable group;

as a ninth aspect, the underlayer film-forming composition for a self-assembled film according to the eighth aspect, in which the crosslinkable group is a hydroxy group, an epoxy group, a protected hydroxy group, or a protected carboxy group;

as a tenth aspect, the underlayer film-forming composition for a self-assembled film according to any one of the first aspect to the ninth aspect, the underlayer film-forming composition further comprising a crosslinking agent;

as an eleventh aspect, the underlayer film-forming composition for a self-assembled film according to any one of the first aspect to the tenth aspect, the underlayer film-forming composition further comprising an acid or an acid generator;

as a twelfth aspect, the underlayer film-forming composition for a self-assembled film according to any one of the first aspect to the eleventh aspect, in which the self-assembled film is a film formed from a block polymer comprising an organic polymer chain (A) that includes an organic monomer (a) as a unit structure and comprising a polymer chain (B) that includes a monomer (b) different from the organic monomer (a) as a unit structure and is bonded to the organic polymer chain (A);

as a thirteenth aspect, the underlayer film-forming composition for a self-assembled film according to the twelfth aspect, in which the block polymer is a block polymer formed by combining polystyrene (A) and polymethyl methacrylate (B), polystyrene (A) and polyisoprene (B), polystyrene (A) and polybutadiene (B), polystyrene (A) and polydimethylsiloxane (B), polystyrene (A) and poly(ethylene oxide) (B), or polystyrene (A) and poly(vinylpyridine) (B);

as a fourteenth aspect, a method for forming a pattern structure constituting a self-assembled film, the method comprising the steps of: applying the underlayer film-forming composition for a self-assembled film according to any one of the first aspect to the thirteenth aspect onto a substrate and baking the applied underlayer film-forming composition to form an underlayer film; and applying a self-assembled film-forming composition onto the underlayer film and baking the applied self-assembled film-forming composition;

as a fifteenth aspect, a method for forming a pattern structure constituting a self-assembled film, the method comprising the steps of: applying the underlayer film-forming composition for a self-assembled film according to the eighth aspect or the ninth aspect onto a substrate and baking the applied underlayer film-forming composition to form an underlayer film; bringing the underlayer film into contact with a solvent to remove a surface layer of the underlayer film; and applying a self-assembled film-forming composition onto the underlayer film after removal of the surface layer and baking the applied self-assembled film-forming composition;

as a sixteenth aspect, the method for forming a pattern structure according to the fourteenth aspect or the fifteenth aspect, the method further comprising the step of forming a base film on a base material before applying the underlayer film-forming composition for a self-assembled film and baking the applied underlayer film-forming composition to form an underlayer film;

as a seventeenth aspect, the method for forming a pattern structure according to the sixteenth aspect, in which the base film is an anti-reflective film or a hard mask; and as an eighteenth aspect, a device obtained by the method for forming a pattern structure according to any one of the fourteenth aspect to the seventeenth aspect.

Effects of the Invention

The underlayer film-forming composition for a self-assembled film of the present invention enables the formation of an underlayer film that facilitates the arrangement of a self-assembled film formed on the underlayer film into a desired vertical pattern.

An underlayer film formed from the underlayer film-forming composition for a self-assembled film of the present invention causes no intermixing with a self-assembled film formed as the upper layer and enables the formation of a vertical pattern of the self-assembled film.

The underlayer film-forming composition of the present invention is a composition for forming an underlayer film for a self-assembled film specifically formed from an organic polymer chain (A) that includes an organic monomer (a) as a unit structure and a polymer chain (B) that includes a monomer (b) different from the organic monomer (a) as a unit structure and is bonded to the organic polymer chain (A) and are obtained by heat baking the polymer.

An underlayer film formed from the underlayer film-forming composition of the present invention allows the block polymer in such a self-assembled film to induce micro-phase separation and to be self-assembled.

In particular, the polymer contained in the underlayer film-forming composition of the present invention is a polymer including a unit structure of a polycyclic aromatic vinyl compound, such as a unit structure of vinylnaphthalene. An underlayer film formed from the polymer allows a self-assembling polymer present in a self-assembled film as the upper layer to cause micro-phase separation and enables the formation of a self-assembled film having a perpendicular lamellar structure or a perpendicular cylinder structure.

Various applications of such a self-assembled film micro-phase-separated by the underlayer film formed from the underlayer film-forming composition for a self-assembled film of the present invention are conceivable by using differences in polymer characteristics between the organic polymer chain (A) and the polymer chain (B). For example, by using differences in etching rate (the difference in alkali dissolution rate or the difference in gas etching rate) between the polymers, a pattern corresponding to a resist pattern can be formed.

MODES FOR CARRYING OUT THE INVENTION

Figure 1:
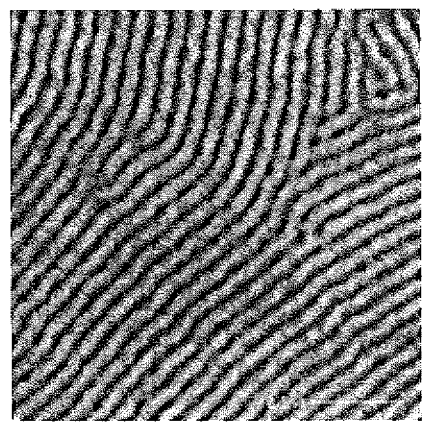
FIG. 1 is a scanning electron micrograph (a magnification of 200,000) illustrating a state in which a self-assembled film including a block polymer was formed on an underlayer film of the self-assembled film obtained from Example 1 and the self-assembled film formed a perpendicular lamellar structure.

The present invention intends to provide an underlayer film-forming composition for self-assembled films, and specifically relates to an underlayer film-forming composition that is for self-assembled films and comprises a polymer including 0.2% by mole or more of a unit structure of a polycyclic aromatic vinyl compound relative to all the unit structures of the polymer.

The underlayer film-forming composition for self-assembled films of the present invention comprises the polymer and preferably a solvent, may further comprise a crosslinking agent, and may further comprise an acid or an acid generator. The composition may comprise a surfactant if desired.

The underlayer film-forming composition for self-assembled films of the present invention is a composition for forming a film that underlies a self-assembled film. The underlayer film-forming composition is applied onto a substrate and baked to form an underlayer film, and a self-assembled film-forming composition is applied onto the underlayer film and dried to form the self-assembled film.

The underlayer film-forming composition of the present invention may have a solid content of 0.01% by mass to 20% by mass, 0.01% by mass to 15% by mass, or 0.1% by mass to 15% by mass. The solid content is the ratio of a residue obtained by removing solvents and water from the underlayer film-forming composition.

In the underlayer film-forming composition of the present invention, the ratio of the polymer may be 60% by mass to 100% by mass, 70% by mass to 99% by mass, or 70% by mass to 99% by mass relative to all the solid contents.

[Underlayer Film-Forming Composition for Self-Assembled Films]

<Polymer>

The underlayer film-forming composition of the present invention preferably comprises a polymer including 20% by mole or more of a unit structure of an aromatic vinyl compound relative to all the unit structures of the polymer and including a unit structure of a polycyclic aromatic vinyl compound in a range of 1% by mole or more, 20% by mole to 100% by mole, or 50% by mole to 100% by mole relative to all the unit structures of the aromatic vinyl compound.

The aromatic vinyl compound preferably includes an optionally substituted vinylnaphthalene, an optionally substituted acenaphthylene, or an optionally substituted vinylcarbazole, and the polycyclic aromatic vinyl compound is preferably vinylnaphthalene, acenaphthylene, or vinylcarbazole.

The polymer included in the underlayer film-forming composition of the present invention contains the polycyclic aromatic vinyl compound as an essential component, and may optionally contain the aromatic vinyl compound, which is a broader concept compound of the polycyclic aromatic vinyl compound.

Examples of the polycyclic aromatic vinyl compound include vinylnaphthalene, vinylanthracene, acenaphthylene, and vinylcarbazole. The aromatic vinyl compound except the polycyclic aromatic vinyl compound is exemplified by styrene.

The aromatic vinyl compound preferably includes an optionally substituted styrene and an optionally substituted vinylnaphthalene, an optionally substituted acenaphthylene, or an optionally substituted vinylcarbazole, where the polycyclic aromatic vinyl compound may be vinylnaphthalene, acenaphthylene, or vinylcarbazole.

The aromatic vinyl compound is preferably an optionally substituted styrene and an optionally substituted vinylnaphthalene, an optionally substituted acenaphthylene, or an optionally substituted vinylcarbazole, where the polycyclic aromatic vinyl compound may be accordingly an optionally substituted vinylnaphthalene, an optionally substituted acenaphthylene, or an optionally substituted vinylcarbazole.

When the aromatic vinyl compound consists of the polycyclic aromatic vinyl compound only, the aromatic vinyl compound may be an optionally substituted vinylnaphthalene, an optionally substituted acenaphthylene, or an optionally substituted vinylcarbazole.

In such a case, the polymer preferably contains 60% by mole to 95% by mole of the unit structure of the aromatic vinyl compound relative to all the unit structures of the polymer.

The aromatic vinyl compound may be copolymerized with the polycyclic aromatic vinyl compound to form a polymer.

In the aromatic vinyl compound and the polycyclic aromatic vinyl compound, the substituent on the aromatic ring is exemplified by an alkyl group, a hydroxy group, a carboxy group, and halogen groups (for example, a fluoro group, a chloro group, a bromo group, and an iodo group). Examples of the alkyl group include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group. The alkyl group may be a cyclic alkyl group. Examples of a cyclic $C_{1-10}$ alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

The polymer may further include a unit structure having a crosslinkable group as a copolymerization component. When including the unit structure having a crosslinkable group, the polymer may contain the unit structure having a crosslinkable group in a ratio of 1% by mole to 80% by mole and preferably 5% by mole to 40% by mole relative to all the unit structures of the polymer.

The crosslinkable group may be a hydroxy group, an epoxy group, a protected hydroxy group, or a protected carboxy group.

The monomer including a unit structure having a hydroxy group is exemplified by vinyl group-containing hydroxy groups derived from hydroxyalkyl(meth)acrylate, vinyl alcohol, and the like and phenolic hydroxy groups such as hydroxystyrene. The alkyl group is exemplified by the above-mentioned alkyl groups, and the examples include a methyl group, an ethyl group, a propyl group, an isopropyl group, and a butyl group. In the present specification, the (meth)acrylate means both methacrylate and acrylate.

The monomer including a unit structure having an epoxy group is exemplified by vinyl group-containing epoxy groups derived from epoxy(meth)acrylate, glycidyl(meth) acrylate, and the like.

The monomer including a unit structure having a protected hydroxy group is exemplified by the monomer (4-tert-butoxystyrene) prepared by protecting the hydroxy group of hydroxystyrene with a tertiary butoxy (tert-butoxy) group. The monomer is further exemplified by monomers having a protected hydroxy group prepared by reacting a phenolic hydroxy group of hydroxystyrene or the like with a vinyl ether compound and monomers having a protected hydroxy group prepared by reacting an alcoholic hydroxy group of hydroxyethyl methacrylate or the like with a vinyl ether compound. Examples of the vinyl ether compound include aliphatic vinyl ether compounds having a $C_{1-10}$ alkyl chain and a vinyl ether group, such as methyl vinyl ether, ethyl vinyl ether, isopropyl vinyl ether, n-butyl vinyl ether, 2-ethylhexyl vinyl ether, tert-butyl vinyl ether, and cyclohexyl vinyl ether; and cyclic vinyl ether compounds such as 2,3-dihydrofuran, 4-methyl-2,3-dihydrofuran, and 2,3-dihydro-4H-pyran.

The monomer including a unit structure having a protected carboxy group is exemplified by monomers having a protected carboxy group prepared by reacting a carboxy group of (meth)acrylic acid or vinylbenzoic acid with a vinyl ether compound. The vinyl ether compound used here is exemplified by the above-mentioned vinyl ether compounds.

In addition to the unit structures of the aromatic vinyl compound, the unit structures of the polycyclic aromatic vinyl compound, and the unit structures having the crosslinkable group, the polymer contained in the underlayer film-forming composition of the present invention may include a polymer prepared by further copolymerizing a vinyl compound as a unit structure. When the polymer includes the unit structure of a vinyl compound, the polymer may contain the unit structure derived from the vinyl compound in a ratio of 1% by mole to 80% by mole and preferably 5% by mole to 40% by mole relative to all the unit structures of the polymer.

Examples of the vinyl compound include methyl(meth) acrylate, ethyl(meth)acrylate, n-hexyl(meth)acrylate, isopropyl(meth)acrylate, cyclohexyl(meth)acrylate, benzyl (meth)acrylate, phenyl(meth)acrylate, anthrylmethyl(meth) acrylate, 2,2,2-trifluoroethyl(meth)acrylate, 2,2,2-trichloroethyl(meth)acrylate, 2-bromoethyl(meth)acrylate, 4-hydroxybutyl(meth)acrylate, 2-methoxyethyl(meth)acrylate, butoxy(2-ethyl)(meth)acrylate, 2-methyl-2-adamantyl (meth)acrylate, (meth)acrylamide, N-methyl(meth)acrylamide, N-ethyl(meth)acrylamide, N-benzyl(meth)acrylamide, N-phenyl(meth)acrylamide, N,N-dimethyl(meth)acrylamide, N-anthryl(meth)acrylamide, methyl vinyl ether, ethyl vinyl ether, benzyl vinyl ether, vinylacetic acid, vinyltrimethoxysilane, 2-chloroethyl vinyl ether, and 2-methoxyethyl vinyl ether.

The polymer included in the underlayer film-forming composition for self-assembled films of the present invention may have a weight-average molecular weight ranging from 1,000 to 200,000, 1,000 to 100,000, or 1,000 to 50,000.

The weight-average molecular weight can be determined by GPC. The GPC measurement can be carried out under conditions, for example, using a GPC apparatus (trade name: HLC-8220GPC, manufactured by Tosoh Corporation), using a GPC column (trade name: Shodex KF803L, KF802, KF801, manufactured by Showa Denko K.K.), at a column temperature of 40° C., using tetrahydrofuran as the eluent (elution solvent), at a flow rate (flow speed) of 1.0 ml/min, and using polystyrene (manufactured by Showa Denko K.K.) as the standard sample.

<Crosslinking Agent Component>

The underlayer film-forming composition for self-assembled films of the present invention may contain a crosslinking agent component. The crosslinking agent is exemplified by melamine compounds, substituted urea compounds, and polymeric compounds thereof. The crosslinking agent is preferably a crosslinking agent having at least two crosslinkable substituents. Specific examples of the agent include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Condensates of these compounds may also be used.

The amount of the crosslinking agent in the underlayer film-forming composition for self-assembled films of the present invention varies according to a coating solvent to be used, an underlying substrate to be used, a required solution viscosity, a required film shape, and the like. The amount is 0.001% by mass to 80% by mass, preferably 0.01% by mass to 50% by mass, and more preferably 0.05% by mass to 40% by mass relative to all the solid contents.

Although such a crosslinking agent may cause crosslinking reaction by self-condensation, when the polymer of the present invention has a crosslinkable substituent, the crosslinking agent can be crosslinked with such a crosslinkable substituent.

<Acid or Acid Generator>

In the present invention, an acid or an acid generator may be contained as a catalyst for accelerating the crosslinking reaction. In other words, an acidic compound such as p-toluenesulfonic acid, trifluoromethanesulfonic acid, pyridinium p-toluenesulfonate, salicylic acid, sulfosalicylic acid, citric acid, benzoic acid, hydroxybenzoic acid, and naphthalenecarboxylic acid and/or a thermal acid generator such as 2,4,4,6-tetrabromocyclohexadienone, benzoin tosylate, 2-nitrobenzyl tosylate, and other organic sulfonic acid alkyl esters may be contained. The amount of such a catalyst is 0.0001% by mass to 20% by mass, preferably 0.0005% by mass to 10% by mass, and more preferably 0.01% by mass to 3% by mass relative to all the solid contents of the underlayer film-forming composition of the present invention.

Examples of the acid generator include not only thermal acid generators but also photo acid generators.

The photo acid generator generates acids during the exposure of a resist, and thus can control the acidity of an underlayer film. This is one method for matching the acidity of the underlayer film to the acidity of an upper layer resist. The adjustment of the acidity of the underlayer film allows the adjustment of a pattern shape of a resist formed as the upper layer.

The photo acid generator contained in the underlayer film-forming composition for self-assembled films of the present invention is exemplified by onium salt compounds, sulfonimide compounds, and disulfonyldiazomethane compounds.

Examples of the onium salt compound include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-n-butanesulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo acid generators may be used singly or in combination of two or more of them.

When the photo acid generator is used, the ratio is 0.01 part by mass to 5 parts by mass, 0.1 part by mass to 3 parts by mass, or 0.5 part by mass to 1 part by mass relative to 100 parts by mass of the solid contents of the underlayer film-forming composition of the present invention.

<Other Additives>

The underlayer film-forming composition of the present invention may further contain a rheology control agent, an adhesion assistant, a surfactant, and the like as necessary in addition to the above-mentioned components.

The rheology control agent is added for the purpose of mainly improving the flowability of the underlayer film-forming composition, and, specifically in a baking step, improving the film thickness uniformity of the underlayer film-forming composition. Specific examples of the agent include phthalic acid derivatives such as dimethyl phthalate, diethyl phthalate, diisobutyl phthalate, dihexyl phthalate, and butyl isodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate.

Such a rheology control agent is typically contained in a ratio of less than 30% by mass relative to all the solid contents of the underlayer film-forming composition of the present invention.

The surfactant may be added to suppress generation of pinholes, striations, or the like of the underlayer film-forming composition and to further improve the coating properties against surface unevenness. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including EFTOP EF301, EF303, and EF352 (manufactured by Mitsubishi Materials Electronic Chemicals Co., Ltd. (formerly Tochem Products), trade name), MEGAFAC F171, F173, and R-30 (manufactured by DIC Corporation, trade name), Fluorad FC430 and FC431 (manufactured by Sumitomo 3M Limited, trade name), Asahiguard AG710, and Surflon S-382, SC101, SC102, SC103, SC104, SC105, and SC106 (manufactured by Asahi Glass Co., Ltd., trade name); and organosiloxane polymer KP341 (manufactured by Shin-Etsu Chemical Co., Ltd.).

The amount of such a surfactant is typically 2.0% by mass or less and preferably 1.0% by mass or less relative to all the solid contents of the underlayer film-forming composition of the present invention. These surfactants may be added singly or in combination of two or more of them.

<Solvent>

In the underlayer film-forming composition of the present invention, examples of the solvent used for producing the underlayer film-forming composition by dissolving the above-mentioned polymer and, if desired, the crosslinking agent component, the crosslinking catalyst, and the like include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and γ-butyrolactone. These organic solvents are used singly or in combination of two or more of them.

A high-boiling point solvent such as propylene glycol monobutyl ether and propylene glycol monobutyl ether acetate may further be mixed to use.

Among these solvents, propylene glycol monomethyl ether, propylene glycol monomethyl ether acetate, butyl acetate, ethyl lactate, butyl lactate, γ-butyrolactone, cyclohexanone, and the like are preferably used for improving the leveling properties.

[Method for Forming Pattern Structure]

The use of the underlayer film-forming composition for self-assembled films of the present invention will next be described.

Through a step of applying the above-mentioned underlayer film-forming composition for self-assembled films onto a substrate and baking the applied underlayer film-forming composition to form an underlayer film and a step of applying the self-assembled film-forming composition described later onto the underlayer film and baking the applied self-assembled film-forming composition, a pattern structure (also called a micro-phase-separated structure) constituting the self-assembled film is formed.

Examples of the substrate include a silicon wafer substrate, a silicon/silicon dioxide coated substrate, a silicon nitride substrate, a glass substrate, an ITO substrate, a polyimide substrate, and a low dielectric constant material (low-k material)-coated substrate.

Onto the substrate, the underlayer film-forming composition of the present invention is applied with an appropriate coating method such as a spinner and a coater and then is baked to form an underlayer film.

The baking conditions are appropriately selected from a baking temperature of 80° C. to 300° C. or 80° C. to 250° C. and a baking time of 0.3 minute to 60 minutes. The baking temperature is preferably 150° C. to 250° C., and the baking time is preferably 0.5 minute to 2 minutes.

The underlayer film formed here has a film thickness of, for example, 10 nm to 1,000 nm, 20 nm to 500 nm, 10 nm to 300 inn, or 5 nm to 100 nm.

Next, on the obtained underlayer film, a layer of a self-assembled film is formed, for example. The layer of the self-assembled film is formed by applying a solution of a self-assembled film-forming composition described later onto the underlayer film and baking the applied self-assembled film-forming composition. The baking temperature is appropriately selected from 80° C. to 140° C., and the baking time is appropriately selected from 0.3 minute to 60 minutes, for example. The baking temperature is preferably 80° C. to 120° C., and the baking time is preferably about 0.5 minute to 2 minutes.

The self-assembled film has a film thickness of 30 nm to 10,000 nm, 20 inn to 2,000 nm, or about 10 nm to 200 nm, for example.

<Self-Assembled Film and Self-Assembled Film-Forming Composition>

The self-assembled film used in the present invention may be a film formed from a block polymer that comprises an organic polymer chain (A) including an organic monomer (a) as a unit structure and an organic polymer chain (B) including a monomer (b) different from the organic monomer (a) as a unit structure and is formed by bonding the organic polymer chain (B) to the organic polymer chain (A).

A composition (called self-assembled film-forming composition) for forming the self-assembled film may contain the block polymer and the organic solvent described later, where the self-assembled film-forming composition may have a solid content of 0.1% by mass to 70% by mass, 0.1% by mass to 50% by mass, or 0.1% by mass to 30% by mass. The solid content is the ratio of a residue obtained by removing solvents from the self-assembled film-forming composition.

In the self-assembled film-forming composition, the ratio of the block polymer may be 30% by mass to 100% by mass, 50% by mass to 100% by mass, 50% by mass to 90% by mass, or 50% by mass to 80% by mass relative to all the solid contents.

The block polymer may contain two or three or more types of blocks. The number of blocks in the block polymer may be 2 or 3 or more.

By changing the organic polymer chain (B), for example, an organic polymer chain (C) containing a monomer (c) as a unit structure may be used in the block polymer.

Accordingly, the pattern of the block polymer may be exemplified by AB, ABAB, ABA, and ABC.

The block polymer is preferably synthesized by polymerization chosen from living radical polymerization and living cationic polymerization that involves initiation reaction and growth reaction alone in the polymerization process but involves no side reaction deactivating a growth terminal. In such a polymerization reaction, the growth terminal can retain a growth active reaction during the polymerization reaction. Accordingly prohibited chain transfer allows the generation of a polymer (A) having a uniform length from the monomer (a).

By using the growth terminal of the organic polymer chain (A) and by adding a monomer (b) different from the monomer (a), the monomer (b) undergoes polymerization, and a block polymer (AB) can be formed.

For example, when the types of blocks are two types of A and B, the polymer chain (A) and the polymer chain (B) may have a molar ratio of 1:9 to 9:1, preferably 3:7 to 5:5.

Here, a homopolymer chain A or B is a polymerizable compound having at least one reactive group (a vinyl group or a vinyl group-containing organic group) that can undergo radical polymerization.

The block polymer used in the present invention preferably has a weight-average molecular weight Mn of 1,000 to 100,000 or 5,000 to 100,000. A block copolymer having a weight-average molecular weight of less than 1,000 may have poor coating properties on an underlying substrate, and a block copolymer having a weight-average molecular weight of 100,000 or more may have poor solubility in solvents.

Examples of the monomer (a) and the monomer (b) to form the block polymer include compounds selected from acrylic acid and alkyl esters of the acid, methacrylic acid and alkyl esters of the acid, N,N-dimethyl(meth)acrylamide, dimethylaminoethyl(meth)acrylate optionally converted into quaternary salts, (meth)acrylamide, N-t-butyl(meth) acrylamide, maleic acid and hemiesters of the acid, maleic anhydride, crotonic acid, itaconic acid, hydroxylated (meth) acrylate, diallyldimethylammonium chloride, N-vinyl-2-pyrrolidone, vinyl ether, maleimide, vinylpyridine, vinylimidazole, heterocyclic vinyl compounds, styrene sulfonate, allyl alcohols, vinyl alcohol, esters of $C_{1-13}$ alcohols with acrylic acid or methacrylic acid, fluoroacrylate, styrene, vinyl acetate, vinyl chloride, vinylidene chloride, vinyl propionate, α-methylstyrene, t-butylstyrene, isoprene, butadiene, cyclohexadiene, ethylene, propylene, and vinyltoluene.

The self-assembled film-forming composition used in the present invention may include a block polymer that has no crosslinkable group such as a hydroxy group, an epoxy group, a protected hydroxy group, or a protected carboxy group or has a crosslinkable group. Specifically, the block polymer is formed by combining polystyrene (A) and polymethyl methacrylate (B), polystyrene (A) and polyisoprene (B), polystyrene (A) and polybutadiene (B), polystyrene (A) and polydimethylsiloxane (B), polystyrene (A) and poly(ethylene oxide) (B), or polystyrene (A) and poly(vinylpyridine) (B).

Among them, the block polymer is preferably a polystyrene/poly(methyl methacrylate) copolymer, a polystyrene/polyisoprene copolymer, or a polystyrene/polybutadiene copolymer.

The self-assembled film-forming composition used in the present invention may contain the block polymer and an organic solvent and, as necessary, further contain crosslinkable compounds, crosslinking catalysts, absorbent compounds, surfactants, hardness adjusting polymer compounds, antioxidants, thermal polymerization inhibitors, surface modifiers, defoaming agents, and the like.

The self-assembled film-forming composition of the present invention may further contain β-diketones, colloidal silica, colloidal alumina, organic polymers, silane coupling agents, radical generators, triazene compounds, alkali compounds, and the like.

The self-assembled film-forming composition used in the present invention is typically prepared by dissolving or dispersing the block polymer containing two homopolymer chains (A) and (B) in an organic solvent.

The organic solvent used here is at least one selected from the group consisting of aliphatic hydrocarbon solvents, aromatic hydrocarbon solvents, alcoholic solvents, ketone solvents, ether solvents, ester solvents, nitrogen-containing solvents, and sulfur-containing solvents.

Specific examples of the organic solvent include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcoholic solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanal, heptanol-3, n-octanol, 2-ethylhexanol, sec-octanol, n-nonyl alcohol, 2,6-dimethyl-4-heptanal, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcoholic solvents such as ethylene glycol, propylene glycol, 1,3-butylene glycol, 2,4-pentanediol, 2-methylpentane-2,4-diol, 2,5-hexanediol, 2,4-heptanediol, 2-ethylhexane-1,3-diol, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methyl-2-pyrrolidone; and sulfur-containing solvents such as dimethyl sulfide, diethyl sulfide, thiophene, tetrahydrothiophene, dimethyl sulfoxide, sulfolane, and 1,3-propane sultone.

Among these organic solvents, in particular, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred in terms of the storage stability of a solution of the self-assembled film-forming composition.

For thermal curing of the self-assembled film-forming composition, a catalyst may be used. The catalyst used for the thermal curing may be the acid or the acid generator used to form (cure) an underlayer film from the above-mentioned underlayer film-forming composition of the present invention.

In order to improve adhesion, surface wettability with respect to an underlying substrate, flexibility, planarization performance, and the like, a polymer without the block polymer may be mixed with the self-assembled film-forming composition containing the block polymer, as necessary. The polymer without the block polymer may be a polymer prepared by radical polymerization of the polymerizable compound described below.

In the self-assembled film-forming composition, the mixing ratio of the polymer without the block polymer is 10 parts by mass to 1,000 parts by mass and preferably 10 parts by mass to 100 parts by mass relative to 100 parts by mass of the block polymer.

As the polymer containing no block polymer, a crosslinkable polymer may be used. Examples thereof include the polymer of polymerizable compound such as polymers of hydroxystyrene, tris-(2-hydroxyethyl)-isocyanuric acid, and tris-(2-hydroxyethyl)-isocyanurate(meth)acrylate.

For the polymer containing no block polymer, specific examples of the polymerizable compound include, excluding the above-mentioned compounds, ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di(meth)acrylate, tetrapropylene glycol di(meth)acrylate, nonapropylene glycol di(meth)acrylate, polypropylene glycol di(meth)acrylate, 2,2-bis[4-(acryloxydiethoxy)phenyl]propane, 2,2-bis[4-(methacryloxydiethoxy)phenyl]propane, 3-phenoxy-2-propanoyl acrylate, 1,6-bis(3-acryloxy-2-hydroxypropyl)-hexyl ether, pentaerythritol tri(meth)acrylate, trimethylolpropane tri(meth)acrylate, glycerol tri(meth)acrylate, pentaerythritol tetra(meth)acrylate, dipentaerythritol penta(meth)acrylate, and dipentaerythritol hexa(meth)acrylate. Here, the ethylene glycol di(meth)acrylate means ethylene glycol diacrylate and ethylene glycol dimethacrylate, for example.

For the polymer containing no block polymer, specific examples of the polymerizable compound include the polymerizable compound having an ethylenically unsaturated bond. Examples of the polymerizable compound having the ethylenically unsaturated bond also include urethane compounds that can be obtained by reacting a polyvalent isocyanate compound with a hydroxyalkyl unsaturated carboxylic ester compound, compounds that can be obtained by reacting a polyvalent epoxy compound with a hydroxyalkyl unsaturated carboxylic ester compound, diallyl ester compounds such as diallyl phthalate, and divinyl compounds such as divinyl phthalate.

For the polymer containing no block polymer, specific examples of the polymerizable compound also include the polymerizable compound having a vinyl ether structure. Specific examples of the polymerizable compound having a vinyl ether structure include vinyl 2-chloroethyl ether, vinyl n-butyl ether, 1,4-cyclohexanedimethanol divinyl ether, vinyl glycidyl ether, bis(4-(vinyloxymethyl)cyclohexylmethyl) glutarate, tri(ethylene glycol) divinyl ether, divinyl adipate, diethylene glycol divinyl ether, tris(4-vinyloxy)butyl trimellitate, bis(4-(vinyloxy)butyl) terephthalate, bis(4-(vinyloxy)butyl isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether.

The self-assembled film-forming composition used in the present invention may contain a crosslinking agent as an optional component.

Examples of the crosslinking agent include nitrogen-containing compounds that have a nitrogen atom and that are substituted with a hydroxymethyl group or an alkoxymethyl group such as a methoxymethyl group, an ethoxymethyl group, a butoxymethyl group, and a hexyloxymethyl group. The crosslinking agent can form a crosslinkage with the block polymer or a crosslinkable polymer (excluding the block polymer). When the block polymer has no crosslinkable group, the crosslinking agent is self-crosslinked to form a matrix, which can fix the block polymer.

The crosslinking agent may be used in an amount of 1 part by mass to 50 parts by mass, 3 parts by mass to 50 parts by mass, 5 parts by mass to 50 parts by mass, 10 parts by mass to 40 parts by mass, or 20 parts by mass to 30 parts by mass relative to 100 parts by mass of the block copolymer. By changing the type and the amount of the crosslinking agent, elastic modulus and step coverage can be controlled.

The self-assembled film-forming composition used in the present invention may further contain crosslinking catalysts that can generate cations or radicals by heat baking (heating) to initiate a thermal polymerization reaction of the self-assembled film. The use of the crosslinking catalyst accelerates the reaction by the crosslinking agent.

Examples of the crosslinking catalyst include acid compounds such as p-toluenesulfonic acid, trifluoromethanesulfonic acid, pyridinium p-toluenesulfonate, salicylic acid, camphorsulfonic acid, sulfosalicylic acid, citric acid, benzoic acid, and hydroxybenzoic acid.

The crosslinking catalyst may be aromatic sulfonic acid compounds. Specific examples of the aromatic sulfonic acid compound include p-toluenesulfonic acid, pyridinium p-toluenesulfonate, sulfosalicylic acid, 4-chlorobenzenesulfonic acid, 4-hydroxybenzenesulfonic acid, benzenedisulfonic acid, 1-naphthalenesulfonic acid, and pyridinium 1-naphthalenesulfonate. The crosslinking catalysts may be used singly or in combination of two or more of them.

The crosslinking catalyst may be used in an amount of 0.01 part by mass to 10 parts by mass, 0.05 part by mass to 5 parts by mass, 0.1 part by mass to 3 parts by mass, 0.3 part by mass to 2 parts by mass, or 0.5 part by mass to 1 part by mass relative to 100 parts by mass of the block polymer.

In the present invention, a step of application of a self-assembled film-forming composition onto a processing substrate to form a coating film and a step of photoirradiation or heat baking of the coating film to form a self-assembled film enable the formation of self-assembled films that are used for liquid crystal displays, recording materials for hard disks, solid-state image sensing devices, solar cell panels, light emitting diodes, organic light emitting devices, luminescent films, fluorescent films, MEMS, actuators, anti-reflective materials, resists, resist underlayer films, resist upper layer films, or templates (molds) for nanoimprint.

In the present invention, the underlayer film-forming composition of the present invention on which pattern information is to be recorded by electron beam lithography or laser exposure may be applied to form an underlayer film before the formation of a self-assembled film (thermoset film). Prior to the production of the self-assembled film (thermoset film), a resist is coated on the underlayer film, and lithography is performed. Alternatively, no resist is coated, and lithography is performed. The block polymer contained in the self-assembled film- (thermoset film-) forming composition used in the present invention has pattern forming ability by self-assembling, and thus the resist is not necessarily required so as to make use of the ability in some cases.

Typical applications of the present invention will next be described.

Onto processing substrates (for example, silicon/silicon dioxide coated substrates, silicon wafer substrates, silicon nitride substrates, glass substrates, ITO substrates, polyimide substrates, and low dielectric constant material- (low-k material-) coated substrates) used for the production of semiconductors, liquid crystal displays, recording materials for hard disks, solid-state image sensing devices, solar cell panels, light emitting diodes, organic light emitting devices, luminescent films, fluorescent films, MEMS, actuators, anti-reflective materials, resists, resist underlayer films, resist upper layer films, or templates (molds) for nanoimprint, the underlayer film (Brush Layer, Migaku/Layer) forming composition of the present application on which pattern information is to be recorded with a variation of unevenness or a variation of surface energy by electron beam or laser exposure may be applied. Onto the underlayer film, a self-assembled film-forming composition is applied with an appropriate coating method such as a spinner, a coater, a spray, and an inkjet printing to form a coating film.

When the variation of surface energy is used, the polymer in the underlayer film preferably has a water contact angle between a water contact angle of the organic polymer chain (A) of the block polymer and a water contact angle of the organic polymer chain (B) of the block polymer in the self-assembled film as the upper layer.

In the present invention, an underlayer film is formed by applying the underlayer film-forming composition of the present invention onto a substrate and baking the applied underlayer film-forming composition, a self-assembled film is formed on the underlayer film, and the self-assembled film forms a pattern. The self-assembled film may be applied along a preset pattern guide and may form a self-assembled pattern. The pattern guide can be formed by the application of a resist, exposure, and development.

The self-assembled film that is self-assembled along the pattern guide has an area that is preferentially removed by a developer, an etching gas, or the like according to the type of a unit structure in a polymer chain constituting the self-assembled film. These unit structures may be removed by development to shrink the width of a resist pattern or to form sidewalls.

The photoresist to be applied and formed may be any photoresist that is sensitive to the light used for exposure, and both negative photoresists and positive photoresists may be used. After the photoresist is applied, exposure is carried out through a predetermined mask. Subsequently, development is carried out with an alkaline developer, for example.

Before the self-assembled film-forming composition including a block polymer is applied onto a processing substrate, the underlayer film-forming composition of the present invention is applied to form an underlayer film in order to make the block polymer form patterning of a perpendicular lamellar structure or a perpendicular cylinder structure on the processing substrate in advance.

The underlayer film formed from the underlayer film-forming composition of the present invention contains an aromatic vinyl compound at a particular ratio as described above and thus allows the block polymer contained in the self-assembled film as the upper layer to self-assemble. By varying the surface nature of the underlayer film, pattern information can also be input.

In order to arrange a pattern at an intended position in the underlayer film formed by the underlayer film-forming composition of the present invention on a processing substrate, an external stimulus such as heat, ultraviolet rays, laser, and radiation rays may be applied so as to overlap the arranging position to induce a variation of unevenness or surface energy (hydrophilic/hydrophobic), and thus a component of the polymer chain (A) and a component of the polymer chain (B) in the self-assembled film-forming composition including the block polymer can be arranged at respective intended positions.

The polymer in the underlayer film used in the present invention includes the aromatic vinyl compound. The aromatic ring (for example, a naphthalene ring and a benzene ring) bonded to a main chain is thought to sensitively respond to an external stimulus, resulting in the change of the shape to record information.

After the formation of the underlayer film, the self-assembled film having an alkali dissolution rate, a solvent dissolution rate, or a gas etching rate that varies with the type of a unit structure of a polymer chain in the self-assembled film is arranged at an intended position; a resist film is formed; ultraviolet rays or radiation rays are applied onto the resist so as to overlap the arranging position; development is carried out to dissolve the resist together with the self-assembled film having an alkali dissolution rate or a solvent dissolution rate that varies; this completes high contrast development; and consequently an excellent resist pattern can be formed.

The present invention thus also intends to provide a method for forming a pattern structure constituting a self-assembled film, the method comprising the steps of applying the underlayer film-forming composition for self-assembled films and baking the applied underlayer film-forming composition to form an underlayer film; bringing the underlayer film into contact with a solvent to remove a surface layer of the underlayer film; and applying a self-assembled film-forming composition onto the underlayer film in which the surface layer has been removed and baking the applied self-assembled film-forming composition.

The solvent to be brought into contact with the underlayer film may be the solvent used in the underlayer film-forming composition. By bringing the underlayer film into contact with the solvent, the surface layer of the underlayer film can be removed, and the removal of the surface layer can reduce the film thickness of the underlayer film to $1/10$ or less of the original thickness. The step allows the underlayer film to become a thin film having a thickness of 1 nm to 10 nm, for example.

The method for forming a pattern structure of the present invention may comprise a step of forming a base film on a base material before applying the underlayer film-forming composition for self-assembled films and baking the applied underlayer film-forming composition to form an underlayer film. The base film may be an anti-reflective film, a hard mask, or a similar film.

EXAMPLES

The present invention will now be described in more detail with reference to examples, but the present invention is not limited to these examples.

Synthesis Example 1

8.00 g of 2-vinylnaphthalene (80% by mole relative to the total polymer), 1.05 g of glycidyl methacrylate (10% by mole relative to the total polymer), 1.38 g of butoxy(2-ethyl) methacrylate (10% by mole relative to the total polymer), and 0.6 g of 2,2'-azobisisobutyronitrile were dissolved in 38.03 g of cyclohexanone, and the solution was heated and stirred at 85° C. for about 15 hours. The resulting polymer corresponded to Formula (1-1) and had a weight-average molecular weight Mw of 6,000 in terms of polystyrene by GPC measurement.

Formula (1-1)

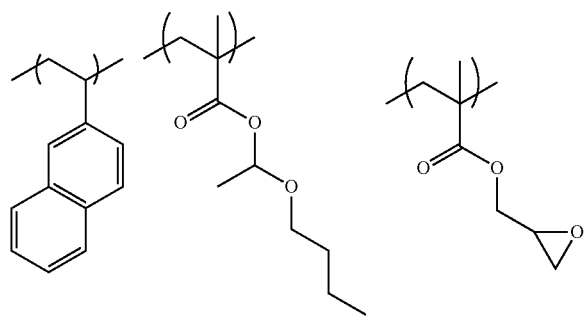

Synthesis Example 2

12.0 g of 2-vinylnaphthalene (70% by mole relative to the total polymer), 2.4 g of glycidyl methacrylate (15% by mole relative to the total polymer), 3.2 g of butoxy(2-ethyl) methacrylate (15% by mole relative to the total polymer) and 0.72 g of 2,2'-azobisisobutyronitrile were dissolved in 35.4 g of propylene glycol monomethyl ether acetate, and the solution was heated and stirred at 85° C. for about 19 hours. The resulting polymer corresponded to Formula (1-2) and had a weight-average molecular weight Mw of 8,380 in terms of polystyrene by GPC measurement.

Formula (1-2)

Synthesis Example 3

20.0 g of 2-vinylnaphthalene (80% by mole relative to the total polymer), 4.2 g of hydroxyethyl methacrylate (20% by mole relative to the total polymer) and 1.2 g of 2,2'-azobisisobutyronitrile were dissolved in 106.7 g of propylene glycol monomethyl ether acetate, and the solution was heated and stirred at 85° C. for about 15 hours. The resulting polymer corresponded to Formula (1-3) and had a weight-average molecular weight Mw of 4,150 in terms of polystyrene by GPC measurement.

Formula (1-3)

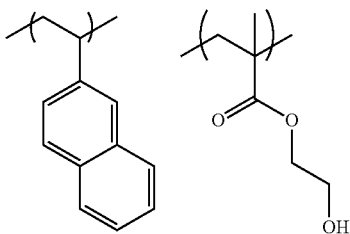

Synthesis Example 4

18.0 g of 2-vinylnaphthalene (90% by mole relative to the total polymer), 1.69 g of hydroxyethyl methacrylate (10% by mole relative to the total polymer) and 0.98 g of 2,2'-azobisisobutyronitrile were dissolved in 48.4 g of propylene glycol monomethyl ether acetate, and the solution was heated and stirred at 85° C. for about 20 hours. The resulting polymer corresponded to Formula (1-4) and had a weight-average molecular weight Mw of 8,420 in terms of polystyrene by GPC measurement.

Formula (1-4)

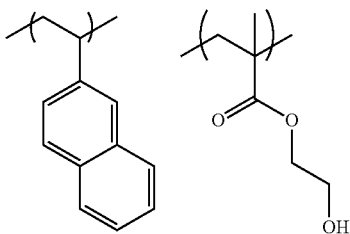

Synthesis Example 5

25.0 g of 2-vinylnaphthalene (50% by mole relative to the total polymer), 28.6 g of 4-tert-butoxystyrene (50% by mole relative to the total polymer) and 2.69 g of 2,2'-azobisisobutyronitrile were dissolved in 131.3 g of propylene glycol monomethyl ether, and the solution was heated and stirred at 85° C. for about 20 hours. The resulting polymer corresponded to Formula (1-5) and had a weight-average molecular weight Mw of 8,180 in terms of polystyrene by GPC measurement.

Formula (1-5)

Synthesis Example 6

18.0 g of 2-vinylnaphthalene (60% by mole relative to the total polymer), 3.90 g of methyl methacrylate (20% by mole relative to the total polymer), 5.06 g of hydroxyethyl methacrylate (20% by mole relative to the total polymer) and 1.35 g of 2,2'-azobisisobutyronitrile were dissolved in 66.0 g of propylene glycol monomethyl ether acetate, and the solution was heated and stirred at 85° C. for about 20 hours. The resulting polymer corresponded to Formula (1-6) and had a weight-average molecular weight Mw of 7,500 in terms of polystyrene by GPC measurement.

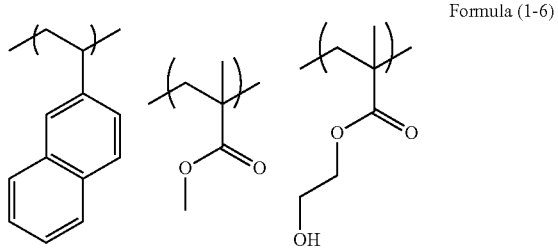

Formula (1-6)

Synthesis Example 7

8.88 g of 2-vinylnaphthalene (20% by mole relative to the total polymer), 18.0 g of styrene (60% by mole relative to the total polymer), 7.51 g of hydroxyethyl methacrylate (20% by mole relative to the total polymer) and 1.72 g of 2,2'-azobisisobutyronitrile were dissolved in 84.4 g of propylene glycol monomethyl ether acetate, and the solution was heated and stirred at 85° C. for about 20 hours. The resulting polymer corresponded to Formula (1-7) and had a weight-average molecular weight Mw of 8,520 in terms of polystyrene by GPC measurement.

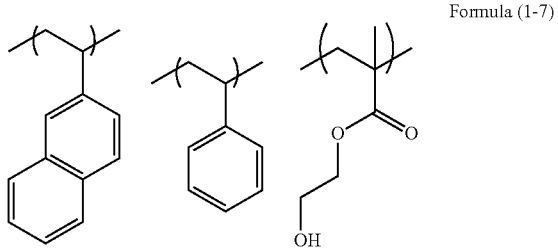

Formula (1-7)

Synthesis Example 8

11.00 g of acenaphthylene (80% by mole relative to the total polymer), 2.32 g of hydroxyethyl methacrylate (20% by mole relative to the total polymer) and 0.40 g of 2,2'-azobisisobutyronitrile were dissolved in 32.01 g of propylene glycol monomethyl ether acetate, and the solution was heated and stirred at 85° C. for about 18 hours. The resulting polymer corresponded to Formula (1-8) and had a weight-average molecular weight Mw of 8,820 in terms of polystyrene by GPC measurement.

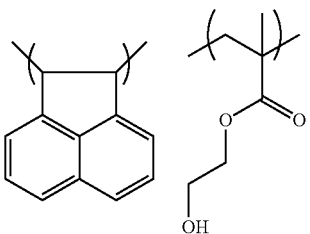

Formula (1-8)

Synthesis Example 9

11.00 g of vinylcarbazole (80% by mole relative to the total polymer), 1.85 g of hydroxyethyl methacrylate (20% by mole relative to the total polymer) and 0.39 g of 2,2'-azobisisobutyronitrile were dissolved in 30.89 g of cyclohexanone, and the solution was heated and stirred at 85° C. for about 19 hours. The resulting polymer corresponded to Formula (1-9) and had a weight-average molecular weight Mw of 6,950 in terms of polystyrene by GPC measurement.

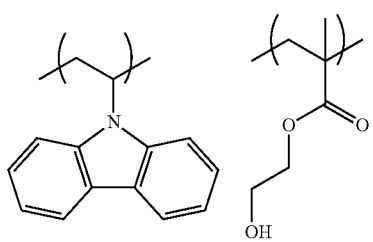

Formula (1-9)

Synthesis Example 10

5.23 g of 2-vinylnaphthalene (60% by mole relative to the total polymer), 2.28 g of methyl methacrylate (40% by mole relative to the total polymer) and 1.50 g of 2,2'-azobis[2-methyl-N-(2-hydroxyethyl)propionamide (manufactured by Wako Pure Chemical Industries, Ltd., product name: VA-086) were dissolved in a mixed solvent of 54.60 g of propylene glycol monomethyl ether acetate and 36.40 g of methanol. The resultant solution was heated and stirred at 100° C. for about 12 hours. The resulting polymer corresponded to Formula (1-10). The terminal of the polymer was bonded to a functional group corresponding to Formula (1-10-1). In Formula (1-10-1), the dotted line indicates the bond with the polymer. The resulting polymer had a weight-average molecular weight Mw of 5,630 in terms of polystyrene by GPC measurement.

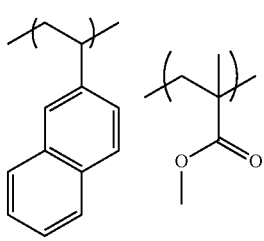

Formula (1-10)

Formula (1-10-1)

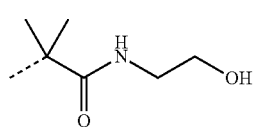

Formula (1-12)

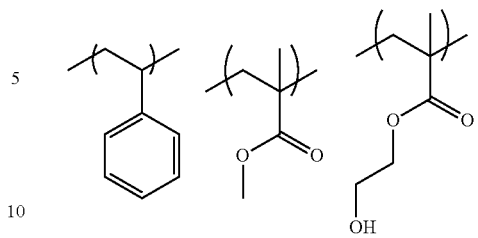

Synthesis Example 11

2.98 g of 2-vinylnaphthalene (30% by mole relative to the total polymer), 4.52 g of methyl methacrylate (70% by mole relative to the total polymer) and 1.50 g of 2,2'-azobis[2-methyl-N-(2-hydroxyethyl)propionamide (manufactured by Wako Pure Chemical Industries, Ltd. product name: VA-086) were dissolved in a mixed solvent of 54.60 g of propylene glycol monomethyl ether acetate and 36.40 g of methanol. The resultant solution was heated and stirred at 100° C. for about 12 hours. The resulting polymer corresponded to Formula (1-11). The terminal of the polymer is bonded to a functional group corresponding to Formula (1-11-1). In Formula (1-11-1), the dotted line indicates the bond with the polymer. The resulting polymer had a weight-average molecular weight Mw of 5,850 in terms of polystyrene by GPC measurement.

Formula (1-11)

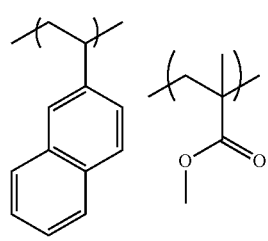

Formula (1-11-1)

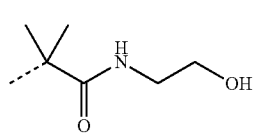

Comparative Synthesis Example 1

6.0 g of styrene (60% by mole relative to the total polymer), 2.0 g of methyl methacrylate (20% by mole relative to the total polymer), 2.0 g of hydroxyethyl methacrylate (20% by mole relative to the total polymer) and 0.50 g of 2,2'-azobisisobutyronitrile were dissolved in 42.0 g of propylene glycol monomethyl ether, and the solution was heated and stirred at 100° C. for about 16 hours. The resulting polymer corresponded to Formula (1-12) and had a weight-average molecular weight Mw of 10,120 in terms of polystyrene by GPC measurement.

Example 1

In 3.38 g of propylene glycol monomethyl ether acetate, 18.0 g of cyclohexanone, and 1.1 g of γ-butyrolactone, 2 g of the resin obtained in Synthesis Example 1 and 0.01 g of a surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 2

In 15.8 g of propylene glycol monomethyl ether acetate and 6.8 g of propylene glycol monomethyl ether, 2 g of the resin obtained in Synthesis Example 2 and 0.01 g of the surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 3

In 6.8 g of propylene glycol monomethyl ether acetate and 15.8 g of propylene glycol monomethyl ether, 2 g of the resin obtained in Synthesis Example 3, 0.3 g of tetramethoxymethylglycoluril, 0.03 g of pyridinium p-toluenesulfonate, and 0.002 g of the surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 4

In 13.5 g of propylene glycol monomethyl ether acetate and 9.0 g of propylene glycol monomethyl ether, 2 g of the resin obtained in Synthesis Example 4, 0.3 g of tetramethoxymethylglycoluril, 0.03 g of pyridinium p-toluenesulfonate, and 0.002 g of the surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 5

In 13.5 g of propylene glycol monomethyl ether acetate and 9.0 g of propylene glycol monomethyl ether, 2 g of the resin obtained in Synthesis Example 5, 0.3 g of tetramethoxymethylglycoluril, 0.03 g of pyridinium p-toluenesulfonate, and 0.002 g of the surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 6

In 13.5 g of propylene glycol monomethyl ether acetate and 9.0 g of propylene glycol monomethyl ether, 2 g of the resin obtained in Synthesis Example 6, 0.3 g of tetramethoxymethylglycoluril, 0.03 g of pyridinium p-toluenesulfonate, and 0.002 g of the surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 7

In 13.5 g of propylene glycol monomethyl ether acetate and 9.0 g of propylene glycol monomethyl ether, 2 g of the resin obtained in Synthesis Example 7, 0.3 g of tetramethoxymethylglycoluril, 0.03 g of pyridinium p-toluenesulfonate, and 0.002 g of the surfactant (manufactured by DIC Corporation, product name: MEGAFAC [trade name] R-30, a fluorochemical surfactant) were dissolved to give a solution. The solution was filtered through a polyethylene microfilter having a pore size of 0.2 μm, preparing a solution of an underlayer film-forming composition for self-assembled films.

Example 8

In 26.6 g of propylene glycol monomethyl ether acetate and 3.0 g of propylene glycol monomethyl ether, 0.37 g of the resin obtained in Synthesis Example 8, 0.07 g of tetramethoxymethylglycoluril, and 0.01 g of pyridinium p-toluenesulfonate were dissolved to give a solution. The solution was filtered through a polyethylene microfilter having a pore size of 0.2 μm, preparing a solution of an underlayer film-forming composition for self-assembled films.

Example 9

In 8.9 g of cyclohexanone, 8.9 g of propylene glycol monomethyl ether acetate and 11.8 g of propylene glycol monomethyl ether, 0.37 g of the resin obtained in Synthesis Example 9, 0.07 g of tetramethoxymethylglycoluril, and 0.01 g of pyridinium p-toluenesulfonate were dissolved to give a solution. The solution was filtered through a polyethylene microfilter having a pore size of 0.2 μm, preparing a solution of an underlayer film-forming composition for self-assembled films.

Example 10

In 13.8 g of propylene glycol monomethyl ether acetate and 5.9 g of propylene glycol monomethyl ether, 0.2 g of the resin obtained in Synthesis Example 4 was dissolved to give a solution. The solution was filtered through a polyethylene microfilter having a pore size of 0.2 μm, preparing a solution of an underlayer film-forming composition for self-assembled films.

Example 11

In 19.8 g of butyl acetate, 0.2 g of the resin obtained in Synthesis Example 10 was dissolved to give a solution. The solution was filtered through a polyethylene microfilter having a pore size of 0.2 μm, preparing a solution of an underlayer film-forming composition for self-assembled films.

Example 12

In 19.8 g of butyl acetate, 0.2 g of the resin obtained in Synthesis Example 11 was dissolved to give a solution. The solution was filtered through a polyethylene microfilter having a pore size of 0.2 μm, preparing a solution of an underlayer film-forming composition for self-assembled films.

Comparative Example 1

In 14.8 g of propylene glycol monomethyl ether acetate and 31.4 g of propylene glycol monomethyl ether, 0.59 g of the resin obtained in Comparative Synthesis Example 1, 0.15 g of tetramethoxymethylglycoluril, and 0.01 g of paraphenol sulfonic acid were dissolved to give a solution. The solution was filtered through a polyethylene microfilter having a pore size of 0.2 μm, preparing a solution of an underlayer film-forming composition for self-assembled films.

(Elution Test in Photoresist Solvent)

Each solution of the underlayer film-forming compositions for self-assembled films prepared in Examples 1 to 9 and Comparative Example 1 was applied onto a silicon wafer using a spin coater. Each solution applied onto the silicon wafer was baked on a hot plate at 240° C. for 1 minute, forming an underlayer film layer for self-assembled films (a film thickness of 0.20 μm). These underlayer film layers were subjected to immersion test in propylene glycol monomethyl ether (PGME) and propylene glycol monomethyl ether acetate (PGMEA), which are solvents used for resists. Table 1 shows the results. The residual film ratio was determined as follows: the underlayer film was immersed in each solvent for 60 seconds; the film thickness was measured before and after the immersion; and the ratio was calculated in accordance with (film thickness after immersion)/(film thickness before immersion)×100.

TABLE 1

| | Residual film ratio (%) after elution test (%) | | |
| --- | --- | --- | --- |
| | | PGME | PGMEA |
| Example 1 | Film after baking at 240° C. | 100% | 100% |
| Example 2 | Film after baking at 240° C. | 100% | 100% |
| Example 3 | Film after baking at 240° C. | 99% | 100% |
| Example 4 | Film after baking at 240° C. | 100% | 100% |
| Example 5 | Film after baking at 240° C. | 100% | 100% |
| Example 6 | Film after baking at 240° C. | 100% | 100% |
| Example 7 | Film after baking at 240° C. | 100% | 100% |
| Example 8 | Film after baking at 240° C. | 100% | 100% |
| Example 9 | Film after baking at 240° C. | 100% | 100% |
| Comparative Example 1 | Film after baking at 240° C. | 98% | 100% |

(Measurement of Dry Etching Rate)

Dry etching rates were determined by using the following etcher and etching gas. RIE-10NR (manufactured by Samco Inc.): $CF_4$ Each solution of the underlayer film-forming compositions for self-assembled films prepared in Examples 1 to 9 and Comparative Example 1 was applied onto a silicon wafer using a spin coater. The solution applied onto the silicon wafer was baked on a hot plate at 240° C. for 1 minute, forming an underlayer film-forming composition for self-assembled films (film thickness of 0.20 µm). The dry etching rate was determined by using $CF_4$ gas as an etching gas.

Separately, a solution of a cresol novolac resin (commercial product, a weight-average molecular weight of 4,000) was applied onto a silicon wafer using a spin coater and the resulting the applied solution was baked at 205° C. for 1 minute, forming an organic hard mask layer (a film thickness of 0.20 µm). The dry etching rate was determined by using $CF_4$ gas as an etching gas in the same manner as for Examples 1 to 9 and Comparative Example 1, and the dry etching rate of the organic hard mask layer was compared with those of Examples 1 to 9 and Comparative Example 1. Table 2 shows the results. The ratios of etching rates (1) are the ratios calculated in accordance with (the dry etching rates of the underlayer films for self-assembled films prepared by baking the applied compositions of Examples 1 to 9 and Comparative Example 1 at 240° C. for 1 minute)/(the dry etching rate of the film prepared by baking the cresol novolac resin at 205° C. for 1 minute).

TABLE 2

Ratio of dry etching rates

| | | |
|---|---|---|
| Example 1 | Ratio of film after baking at 240° C. (1) | 0.83 |
| Example 2 | Ratio of film after baking at 240° C. (1) | 0.86 |
| Example 3 | Ratio of film after baking at 240° C. (1) | 0.92 |
| Example 4 | Ratio of film after baking at 240° C. (1) | 0.82 |
| Example 5 | Ratio of film after baking at 240° C. (1) | 0.83 |
| Example 6 | Ratio of film after baking at 240° C. (1) | 0.93 |
| Example 7 | Ratio of film after baking at 240° C. (1) | 0.93 |
| Example 8 | Ratio of film after baking at 240° C. (1) | 0.82 |
| Example 9 | Ratio of film after baking at 240° C. (1) | 1.00 |
| Comparative Example 1 | Ratio of film after baking at 240° C. (1) | 1.14 |

(Preparation of Block Polymer)

In 32.33 g of propylene glycol monomethyl ether, 1.0 g of polystyrene/poly(methyl methacrylate) copolymer (manufactured by POLYMER SOURCE INC., PS (18,000)-b-PMMA (18,000), polydispersity=1.07) as a block polymer was dissolved, giving a 2% by mass solution. The solution was filtered through a polyethylene microfilter having a pore size of 0.02 µm, preparing a solution of a self-assembled film-forming composition as a block polymer.

(Self-Assembling Evaluation of Block Polymer)

Each underlayer film-forming composition for self-assembled films obtained in Examples 1 to 7 and Comparative Example 1 was applied onto a silicon wafer, and the composition applied on the substrate was heated on a hot plate at 240° C. for 1 minute, giving an underlayer film (A layer) to be present as the underlayer of a self-assembled film. These underlayer film had a film thickness of 200 nm.

Each underlayer film-forming composition for self-assembled films obtained in Example 8 and Example 9 was applied onto a silicon wafer, and the composition applied on the substrate was heated on a hot plate at 240° C. for 1 minute, giving an underlayer film (A layer) to be present as the underlayer of the self-assembled film. These underlayer films had a film thickness of 30 nm.

Each underlayer film-forming composition for self-assembled films obtained in Examples 10 to 12 was applied onto a silicon wafer, and the composition applied on the substrate was heated on a hot plate at 240° C. for 1 minute, giving an underlayer film having a film thickness of 30 nm. The underlayer film was immersed in a mixed solvent of propylene glycol monomethyl ether/propylene glycol monomethyl ether acetate (70/30) for 60 seconds, giving an underlayer film (A layer) to be present as the underlayer of the self-assembled film. Each underlayer film had a film thickness of 3 nm.

Onto each underlayer film (A layer), the self-assembled film-forming composition composed of the above-mentioned block polymer was applied with a spinner, and the composition applied on the substrate was heated on a hot plate at 100° C. for 1 minute, forming a self-assembled film (B layer) having a film thickness of 40 nm. The resulting substrate was subsequently heated on a hot plate at 240° C. for 5 minutes under a nitrogen atmosphere, and a micro-phase-separated structure of the block polymer was induced.

(Observation of Micro-Phase-Separated Structure)

Figure 2:
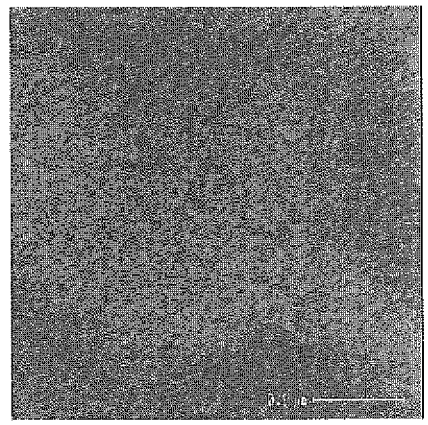
FIG. 2 is a scanning electron micrograph (a magnification of 200,000) illustrating a state in which a self-assembled film including a block polymer was formed on an underlayer film of the self-assembled film obtained from Comparative Example 1 and the self-assembled film formed a horizontal lamellar structure.

The silicon wafer having the induced micro-phase-separated structure was etched for 3 seconds with an etcher (Lam 2300) manufactured by Lam using $O_2/N_2$ gas as the etching gas, and thus the PMMA region was preferentially etched. Subsequently, the shape was observed under a scanning electron microscope (Hitachi S-9380). Table 3 shows the obtained results. FIG. 1 illustrates the scanning electron micrograph of the self-assembled film formed on the underlayer film obtained from Example 1, and FIG. 2 illustrates the scanning electron micrograph of the self-assembled film formed on the underlayer film obtained from Comparative Example 1.

TABLE 3

Shape observation of block polymer (self-assembled film) on underlayer film

| | |
|---|---|
| Underlayer film obtained from Example 1 | Perpendicular lamellar |
| Underlayer film obtained from Example 2 | Perpendicular lamellar |
| Underlayer film obtained from Example 3 | Perpendicular lamellar |
| Underlayer film obtained from Example 4 | Perpendicular lamellar |
| Underlayer film obtained from Example 5 | Perpendicular lamellar |
| Underlayer film obtained from Example 6 | Perpendicular lamellar |
| Underlayer film obtained from Example 7 | Perpendicular lamellar |
| Underlayer film obtained from Example 8 | Perpendicular lamellar |
| Underlayer film obtained from Example 9 | Perpendicular lamellar |
| Underlayer film obtained from Example 10 | Perpendicular lamellar |
| Underlayer film obtained from Example 11 | Perpendicular lamellar |
| Underlayer film obtained from Example 12 | Perpendicular lamellar |
| Underlayer film obtained from Comparative Example 1 | Horizontal lamellar |

As shown in Table 3, the underlayer films obtained from Examples 1 to 12 can induce the micro-phase-separated structure of the block polymer composed of polystyrene and poly(methyl methacrylate) in a direction perpendicular to the substrate in the self-assembled film as the upper layer. As shown by the components contained in the underlayer films obtained from Examples 1 to 12, the ability to induce the structure perpendicular to the substrate was not restricted by any components besides the polycyclic vinyl structure.

In contrast, it is concluded that as shown by the results of the underlayer film obtained from Comparative Example, the film containing no vinylnaphthalene or the like having the polycyclic vinyl structure fails to induce the microphase-separated structure of the block polymer in a direction perpendicular to the substrate in the self-assembled film as the upper layer.

INDUSTRIAL APPLICABILITY

Self-assembled films are used for liquid crystal displays, recording materials for hard disks, solid-state image sensing devices, solar cell panels, light emitting diodes, organic light emitting devices, luminescent films, fluorescent films, MEMS, actuators, anti-reflective materials, resists, resist underlayer films, resist upper layer films, templates for nanoimprint, or the like. In the present invention, a polymer having a polycyclic aromatic vinyl compound is used in an underlayer film of the self-assembled film. The underlayer film particularly containing vinylnaphthalene can induce a micro-phase-separated structure of a block polymer in a perpendicular direction to a substrate.

The invention claimed is:

1. An underlayer film-forming composition for a self-assembled film, the underlayer film-forming composition comprising a polymer including:
   60% by mole to 95% by mole of a unit structure of an aromatic vinyl compound relative to all the unit structures of the polymer,
   5% by mole to 40% by mole of a unit structure having a crosslinkable group having a hydroxy group, an epoxy group, a protected hydroxy group, or a protected carboxy group relative to all the unit structures of the polymer, and
   1% by mole or more of a unit structure of a polycyclic aromatic vinyl compound relative to all unit structures of the polymer,
   wherein the aromatic vinyl compound includes an optionally substituted vinylnaphthalene, an optionally substituted acenaphthylene, or an optionally substituted vinylcarbazole, and the polycyclic aromatic vinyl compound is vinylnaphthalene, acenaphthylene, or vinylcarbazole, and
   the self-assembled film is a film formed from a block polymer that comprises an organic polymer chain (A) including an organic monomer (a) as a unit structure and an organic polymer chain (B) including a monomer (b) different from the organic monomer (a) as a unit structure and is formed by bonding the organic polymer chain (B) to the organic polymer chain (A).

2. An underlayer film-forming composition for a self-assembled film, the underlayer film-forming composition comprising a polymer including:
   60% by mole to 95% by mole of a unit structure of an aromatic vinyl compound relative to all the unit structures of the polymer,
   5% by mole to 40% by mole of a unit structure having a crosslinkable group having a hydroxy group, an epoxy group, a protected hydroxy group, or a protected carboxy group relative to all the unit structures of the polymer, and
   1% by mole or more of a unit structure of a polycyclic aromatic vinyl compound relative to all unit structures of the polymer,
   wherein the aromatic vinyl compound includes an optionally substituted styrene and an optionally substituted vinylnaphthalene, an optionally substituted acenaphthylene, or an optionally substituted vinylcarbazole, and the polycyclic aromatic vinyl compound is vinylnaphthalene, acenaphthylene, or vinylcarbazole, and
   the self-assembled film is a film formed from a block polymer that comprises an organic polymer chain (A) including an organic monomer (a) as a unit structure and an organic polymer chain (B) including a monomer (b) different from the organic monomer (a) as a unit structure and is formed by bonding the organic polymer chain (B) to the organic polymer chain (A).

3. An underlayer film-forming composition for a self-assembled film, the underlayer film-forming composition comprising a polymer including:
   60% by mole to 95% by mole of a unit structure of an aromatic vinyl compound relative to all the unit structures of the polymer,
   5% by mole to 40% by mole of a unit structure having a crosslinkable group having a hydroxy group, an epoxy group, a protected hydroxy group, or a protected carboxy group relative to all the unit structures of the polymer, and
   1% by mole or more of a unit structure of a polycyclic aromatic vinyl compound relative to all unit structures of the polymer,
   wherein the aromatic vinyl compound is an optionally substituted styrene and an optionally substituted vinylnaphthalene, an optionally substituted acenaphthylene, or an optionally substituted vinylcarbazole, and the polycyclic aromatic vinyl compound is an optionally substituted vinylnaphthalene, an optionally substituted acenaphthylene, or an optionally substituted vinylcarbazole, and
   the self-assembled film is a film formed from a block polymer that comprises an organic polymer chain (A) including an organic monomer (a) as a unit structure and an organic polymer chain (B) including a monomer (b) different from the organic monomer (a) as a unit structure and is formed by bonding the organic polymer chain (B) to the organic polymer chain (A).

4. The underlayer film-forming composition for a self-assembled film according to claim 1, further comprising a crosslinking agent.

5. The underlayer film-forming composition for a self-assembled film according to claim 1, further comprising an acid or an acid generator.

6. The underlayer film-forming composition for a self-assembled film according to claim 1, wherein the self-assembled film is a film formed from a block polymer comprising an organic polymer chain (A) that includes an organic monomer (a) as a unit structure and comprising a polymer chain (B) that includes a monomer (b) different from the organic monomer (a) as a unit structure and is bonded to the organic polymer chain (A).

7. The underlayer film-forming composition for a self-assembled film according to claim 6, wherein the block polymer is a block polymer formed by combining polystyrene (A) and polymethyl methacrylate (B), polystyrene (A) and polyisoprene (B), polystyrene (A) and polybutadiene (B), polystyrene (A) and polydimethylsiloxane (B), polystyrene (A) and poly(ethylene oxide) (B), or polystyrene (A) and poly(vinylpyridine) (B).

8. A method for forming a pattern structure constituting a self-assembled film, the method comprising the steps of:
   applying the underlayer film-forming composition for a self-assembled film according to claim 1 onto a substrate and baking the applied underlayer film-forming composition to form an underlayer film; and
   applying a self-assembled film-forming composition onto the underlayer film and baking the applied self-assembled film-forming composition.

9. The method for forming a pattern structure according to claim 8, the method further comprising the step of forming a base film on a base material before applying the underlayer film-forming composition for a self-assembled film and baking the applied underlayer film-forming composition to form an underlayer film.

10. The method for forming a pattern structure according to claim 9, wherein the base film is an anti-reflective film or a hard mask.

11. A device obtained by the method for forming a pattern structure according to claim 8.

* * * * *